(12) United States Patent
Marroquin et al.

(10) Patent No.: US 8,227,942 B2
(45) Date of Patent: Jul. 24, 2012

(54) SYSTEM AND APPARATUS FOR INTERCONNECTING AN ARRAY OF POWER GENERATING ASSEMBLIES

(75) Inventors: Marco A. Marroquin, Austin, TX (US); Thomas Paul Parker, Dallas, TX (US); Stephen P. Wurmlinger, Scurry, TX (US); Robert S. Balog, College Station, TX (US); Trishan Esram, Urbana, IL (US); Jeremiah Noel Foley, Austin, TX (US)

(73) Assignee: SolarBridge Technologies, Inc., Austin, TX (US)

( * ) Notice: Subject to any disclaimer, the term of this patent is extended or adjusted under 35 U.S.C. 154(b) by 0 days.

(21) Appl. No.: 13/344,362

(22) Filed: Jan. 5, 2012

(65) Prior Publication Data
US 2012/0104872 A1 May 3, 2012

Related U.S. Application Data

(63) Continuation of application No. 12/576,661, filed on Oct. 9, 2009.

(51) Int. Cl.
*H01R 25/00* (2006.01)
*H01R 4/00* (2006.01)
*H01R 3/00* (2006.01)
*H02J 3/38* (2006.01)

(52) U.S. Cl. ............... 307/147; 307/43; 307/82; 307/84

(58) Field of Classification Search .................... 307/43, 307/82, 84, 147
See application file for complete search history.

(56) References Cited

U.S. PATENT DOCUMENTS

| | | | |
|---|---|---|---|
| 1,767,262 A | 6/1930 | Schmitz | |
| 3,920,306 A * | 11/1975 | Barnett et al. | 439/459 |
| 4,114,048 A * | 9/1978 | Hull et al. | 307/53 |
| 4,217,633 A | 8/1980 | Evans, Jr. | |
| 4,255,007 A | 3/1981 | Michaels et al. | |
| 4,917,632 A | 4/1990 | Smith | |
| 4,971,576 A | 11/1990 | Thimmesch | |
| 5,191,519 A * | 3/1993 | Kawakami | 363/71 |
| 5,473,528 A * | 12/1995 | Hirata et al. | 363/71 |
| 5,745,356 A * | 4/1998 | Tassitino et al. | 363/71 |
| 5,855,494 A | 1/1999 | Blaszczyk et al. | |
| 5,886,890 A | 3/1999 | Ishida et al. | |

(Continued)

FOREIGN PATENT DOCUMENTS

EP 1837985 A2 9/2007

OTHER PUBLICATIONS

Enphase Energy, "Application Note: Multi-Tenant Design Guidelines," rev. 1, 5 pages, 2008.

(Continued)

*Primary Examiner* — Adi Amrany
(74) *Attorney, Agent, or Firm* — Barnes & Thornburg LLP

(57) ABSTRACT

A system and apparatus for interconnecting an array of power generating assemblies includes a cable assembly having a plurality of continuous conductors and a plurality of cable connectors electrically coupled to the continuous conductors. The continuous conductors are configured to receive inverter AC power generated by inverters and deliver the combined AC power to an AC grid or other power sink. The cable connectors are configured to mate with corresponding connectors of the inverters to deliver the AC power to the continuous conductors.

19 Claims, 10 Drawing Sheets

U.S. PATENT DOCUMENTS

| | | | |
|---|---|---|---|
| 5,951,785 A | 9/1999 | Uchihashi et al. | |
| 6,046,400 A | 4/2000 | Drummer | |
| 6,050,840 A | 4/2000 | Kowalski et al. | |
| 6,074,238 A | 6/2000 | DeRoss et al. | |
| 6,111,189 A | 8/2000 | Garvison et al. | |
| 6,180,868 B1 | 1/2001 | Yoshino et al. | |
| 6,201,180 B1 | 3/2001 | Meyer et al. | |
| D445,090 S | 7/2001 | Payne et al. | |
| 6,268,559 B1 | 7/2001 | Yamawaki | |
| 6,285,572 B1 | 9/2001 | Onizuka et al. | |
| 6,291,764 B1 | 9/2001 | Ishida et al. | |
| 6,356,471 B1* | 3/2002 | Fang | 363/65 |
| 6,381,157 B2* | 4/2002 | Jensen | 363/71 |
| 6,396,170 B1* | 5/2002 | Laufenberg et al. | 307/64 |
| 6,422,891 B1 | 7/2002 | Huang | |
| D472,523 S | 4/2003 | Hansen | |
| 6,593,521 B2 | 7/2003 | Kobayashi | |
| 6,605,881 B2 | 8/2003 | Takehara et al. | |
| 6,713,890 B2* | 3/2004 | Kondo et al. | 290/40 B |
| 6,750,391 B2 | 6/2004 | Bower et al. | |
| 6,791,024 B2 | 9/2004 | Toyomura | |
| 6,838,611 B2* | 1/2005 | Kondo et al. | 136/244 |
| 6,897,370 B2* | 5/2005 | Kondo et al. | 136/243 |
| D511,747 S | 11/2005 | Rey et al. | |
| 7,018,230 B2 | 3/2006 | Shimirak | |
| 7,042,110 B2* | 5/2006 | Mikhail et al. | 290/44 |
| 7,070,443 B2 | 7/2006 | Tashiro et al. | 439/419 |
| 7,072,195 B2* | 7/2006 | Xu | 363/95 |
| D527,346 S | 8/2006 | Brodin | |
| 7,248,490 B2* | 7/2007 | Olsen et al. | 363/71 |
| 7,297,866 B2 | 11/2007 | Aschenbrenner | |
| D559,785 S | 1/2008 | Tosetti | |
| 7,342,171 B2 | 3/2008 | Khouri et al. | |
| 7,387,537 B1 | 6/2008 | Daily et al. | |
| 7,405,494 B2* | 7/2008 | Tassitino et al. | 307/45 |
| 7,456,523 B2* | 11/2008 | Kobayashi | 307/82 |
| D585,837 S | 2/2009 | Kuehne et al. | |
| D599,741 S | 9/2009 | Meldert et al. | |
| 7,638,899 B2* | 12/2009 | Tracy et al. | 307/65 |
| 7,839,022 B2 | 11/2010 | Wolfs | |
| 7,874,860 B2 | 1/2011 | Starke et al. | |
| 7,893,346 B2* | 2/2011 | Nachamkin et al. | 136/244 |
| 7,899,632 B2 | 3/2011 | Fornage et al. | |
| 2005/0213272 A1* | 9/2005 | Kobayashi | 361/62 |
| 2005/0281064 A1* | 12/2005 | Olsen et al. | 363/71 |
| 2006/0083039 A1* | 4/2006 | Oliveira et al. | 363/131 |
| 2007/0221267 A1 | 9/2007 | Fornage | |
| 2007/0252716 A1* | 11/2007 | Burger | 340/635 |
| 2007/0295392 A1 | 12/2007 | Cinnamon | |
| 2007/0295393 A1 | 12/2007 | Cinnamon | |
| 2008/0078436 A1* | 4/2008 | Nachamkin et al. | 136/244 |
| 2008/0194137 A1 | 8/2008 | Kuo | |
| 2008/0283118 A1* | 11/2008 | Rotzoll et al. | 136/251 |
| 2009/0000654 A1* | 1/2009 | Rotzoll et al. | 136/244 |
| 2009/0020151 A1 | 1/2009 | Fornage | |
| 2009/0084426 A1 | 4/2009 | Fornage et al. | |
| 2009/0147554 A1* | 6/2009 | Adest et al. | 363/71 |
| 2009/0200994 A1 | 8/2009 | Fornage | |
| 2009/0242272 A1 | 10/2009 | Little et al. | |
| 2009/0296348 A1 | 12/2009 | Russell et al. | |
| 2010/0138061 A1* | 6/2010 | Walling et al. | 700/287 |
| 2010/0139945 A1 | 6/2010 | Dargatz | |
| 2010/0175338 A1 | 7/2010 | Garcia Cors | |
| 2010/0181830 A1 | 7/2010 | Fornage et al. | |
| 2010/0195357 A1 | 8/2010 | Fornage et al. | |
| 2010/0263704 A1 | 10/2010 | Fornage et al. | |
| 2010/0283325 A1* | 11/2010 | Marcianesi et al. | 307/82 |
| 2010/0309695 A1 | 12/2010 | Fornage | |
| 2011/0012429 A1 | 1/2011 | Fornage | |
| 2011/0012430 A1* | 1/2011 | Cheng et al. | 307/82 |
| 2011/0018353 A1* | 1/2011 | Yu | 307/82 |
| 2011/0019444 A1 | 1/2011 | Dargatz et al. | |
| 2011/0115301 A1* | 5/2011 | Bhavaraju et al. | 307/86 |
| 2011/0168228 A1* | 7/2011 | McGreevy et al. | 136/244 |
| 2011/0183537 A1* | 7/2011 | Fornage et al. | 439/271 |

OTHER PUBLICATIONS

Enphase Energy, "Enphase Field Wiring Diagram—M190 & M210 Microinverters—240v, Single Phase," Drawing No. 144-00001, rev. 6, 1 page, 2009.

Enphase Energy, "Enphase Quick Install Guide," Doc. No. 140-00001, rev. 06, 1 page, 2009.

"Power Cords", Hosa Technology, Inc., www.hosatech.com, Aug. 2010, 1 page.

"Power Cord, Piggyback IEC C13 to NEMA 5-15P, 2 ft", Hosa Technology, Inc., www.hosatech.com, Aug. 2010, 1 page.

Daisy Chain Power Cord Liberator, 12in, CableOrganizer.com, Inc., www.cableorganizer.com, Aug. 2010, 1 page.

"DTCC Connector Division—Geophysical", Dynamic Technologies Co., Ltd., www.dynamictech.biz, Aug. 2010, 4 pages.

"DaisyLink System", Electri-Cable Assemblies, Inc., www.electri-cable.com, Aug. 2010, 2 pages.

International Search Report and Written Opinion of the ISA, International Application No. PCT/US2010/048342, Nov. 3, 2010, 12 pages.

Hoffner, et al., "A PV Window Awning System of the University of Texas Houston Health Science Center Using AC-Modules," Photovoltaic Specialists Conference, Conference Record of the Twenty-Eight IEEE, 2000, 1545-1547, Anchorage, AK.

Strong, et al., "Development of Standardized, Low-Cost AC PV Systems—Phase I Annual Report, Sep. 7, 1995-Nov. 7, 1996, "National Renewable Energy Laboratory, Jun. 1997.

Strong, S., "The Development of Standardize, Low-Cost AC PV Systems—Final Technical Report, Sep. 8, 1995-Jun. 30, 1998," National Renewable Energy Laboratory, Feb. 1999.

Rodriguez, et al., "Long-Lifetime Power Inverter for Photovoltaic AC Modules," IEEE Transactions on Industrial Electronics, Jul. 7, 2008, 2593-2601, 55-7.

Oldenkamp, et al., "AC Modules: Past, Present, and Future," Workshop Installing the Solar Solution, Jan. 22-23, 1998.

Bower, et al. "Innovative PV Micro-Inverter Topology Eliminates Electrolytic Capacitors for Longer Lifetime," Photovoltaic Energy Conversion, Conference Record of the 2006 IEEE 4th World Conference, 2006, 2038-2041, Waikoloa, HI.

Kern, G., "Sunsine 300: Manufacture of an AC Photovoltaic Module, Final Report, Phases I & II, Jul. 25, 1995-Jun. 30, 1998," National Renewable Energy Laboratory, Mar. 1999.

Russell, et al., "Sunsine 300 AC Module, Annual Report, Jul. 25, 1995-Dec. 31, 1996," National Renewable Energy Laboratory, Aug. 1997.

* cited by examiner

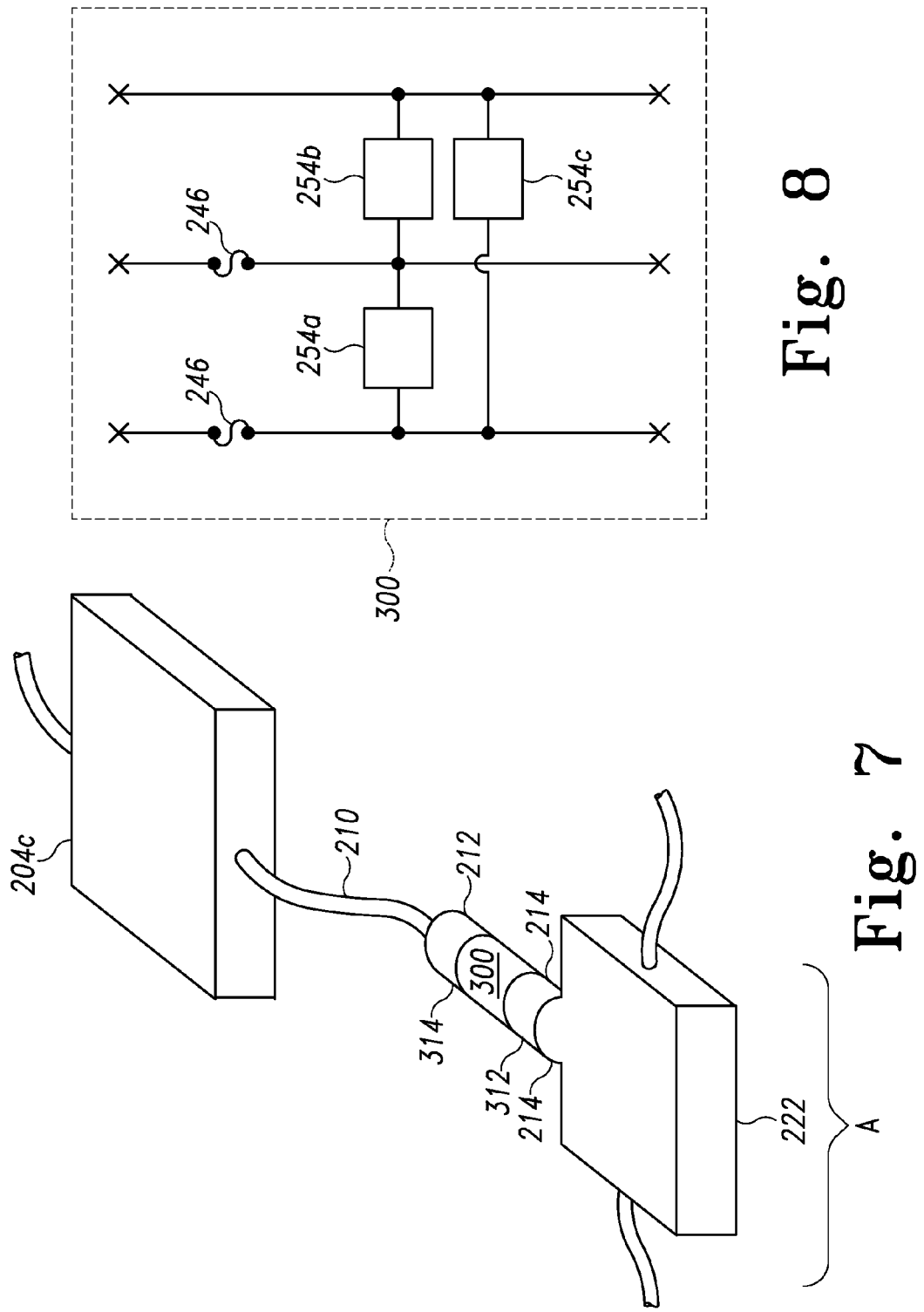

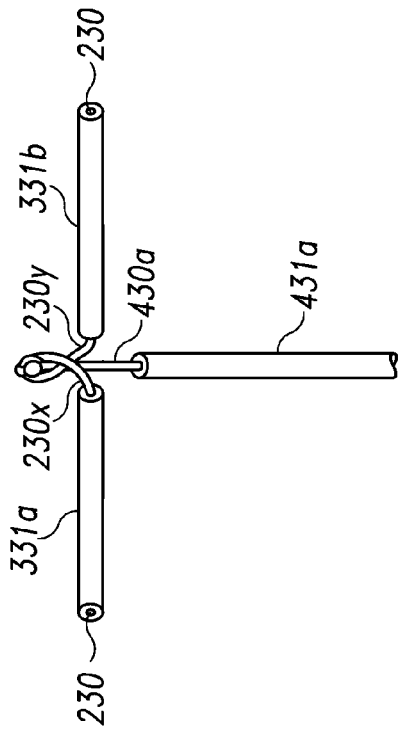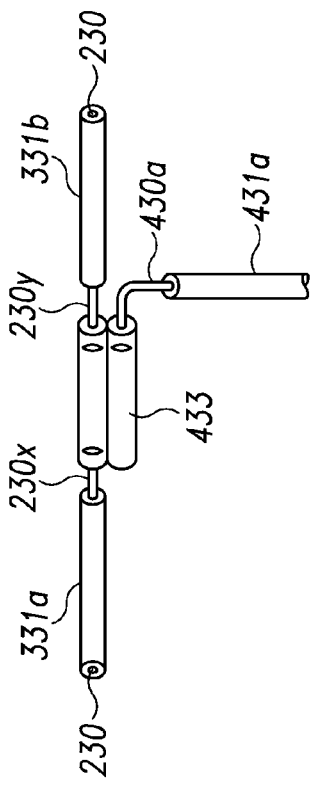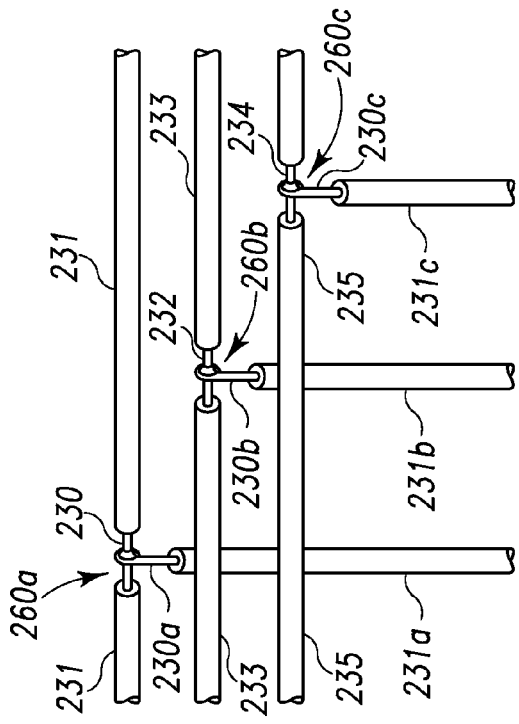

US 8,227,942 B2

SYSTEM AND APPARATUS FOR INTERCONNECTING AN ARRAY OF POWER GENERATING ASSEMBLIES

CROSS-REFERENCE TO RELATED U.S. PATENT APPLICATION

The present application a continuation application of U.S. application Ser. No. 12/576,661, entitled "SYSTEM AND APPARATUS FOR INTERCONNECTING AN ARRAY OF POWER GENERATING ASSEMBLIES," which was filed on Oct. 9, 2009, the entirety of which is hereby incorporated by reference.

TECHNICAL FIELD

The present disclosure relates, generally, to a system and apparatus for delivering power from an array of power generating devices to a power sink and, more particularly, to an apparatus for delivering power from an array of DC-AC inverters to an AC grid.

BACKGROUND

Some power delivery systems comprise an array of power generation subassemblies whose combined output power is delivered to a power sink (a "power sink" being any device or apparatus that receives power from a power source). One example of such a system is a distributed photovoltaic power system in which each one of a plurality of solar panels is provided with a DC-AC inverter ("inverter") that delivers power to an AC utility grid. Delivering the combined power from all of the inverters to the AC grid requires a suitable interconnection scheme. High operating efficiency, low cost, and reliable operation over long periods of time (e.g., twenty five years) may be highly valued features in such systems.

A typical way of interconnecting an array of photovoltaic inverters is illustrated in FIG. 1. As shown in FIG. 1, a distributed photovoltaic system 100 includes a plurality of photovoltaic panels 102 and associated inverters 104a-104d. Power from the photovoltaic panels 102 is delivered to the inverters 104a-104d by PV interconnects 106. Each inverter 104 may include a power input cable 108 and a power output cable 110. The power input cables 108 are terminated in input connectors 112 and the power output cables 110 are terminated in output connectors 114 that mate with the input connectors 112. Each power input connector 112 of each inverter 104 is connected to a power output connector 114 of an adjacent inverter 104 to form mated connectors 116 that may carry power between inverters.

A simplified schematic of the system 100 shown in FIG. 1 for delivering power from inverters 104a-104d to a split-phase AC grid (e.g., a 240 VAC grid comprising two 120 VAC "hot" wires 130, 132 and a neutral wire 134) is shown in FIG. 2. As illustrated in FIG. 2, each inverter 104 includes inverter circuitry 140 that receives DC power from an associated photovoltaic panel 102 and delivers AC power by means of two internal "hot" wires 130a, 132a and an internal neutral wire 134a. When the input connectors 112 and output connectors 114 of the inverters 104a-104d are coupled together to form mated connectors 116, as shown in FIGS. 1 and 3, the input cables 108 and output cables 110 are "daisy chained" (i.e., the cables are connected in series) to form a split-phase power bus 150 that receives power from each of the inverters 104 and carries the combined power to the AC grid 152 (inverters having cables that are connected in this way are referred to herein as "series-connected inverters"). An interface cable 119, connected to the output cable 110 of inverter 104a, delivers the split-phase bus 150 into junction box 120. The junction box 120 may be an electrical panel that connects to the AC grid or, as illustrated in FIGS. 1 and 2, it may provide a connection point between the wires of the split-phase bus 150 and the wiring 124 that connects to the AC grid 152 at a downstream panel (not shown).

Inverter circuitry 140 typically includes fuses and other protective devices, such as surge-protection devices, to protect the system 100 and components of the system 100 from transient electrical events and faults and to prevent failure of the entire system in the event of a failure in a single system subassembly (e.g., one of the inverters 104). One way to incorporate fuses and protective devices into a series-connected inverter 104 is illustrated in FIG. 3. As shown in FIG. 3, the inverter circuitry 140 includes a fuse 146 in series with each hot wire 130a, 132a and surge protection devices 154a, 154b, 154c (e.g., a metal-oxide varistor ("MOV")) connected between each pair of wires 130a, 132a, 134a.

Regulatory and safety requirements may also require that each inverter 140 be connected to earth ground. One way to provide an earth ground to each inverter 140, illustrated in FIGS. 1 and 2, is to provide a ground wire 122 that is connected (e.g., by means of a screw) to each series-connected inverter.

SUMMARY

According to one aspect, a system for delivering power to an AC grid includes a first inverter, a second inverter, and a cable assembly. The first inverter may include a first inverter connector and the second inverter may include a second inverter connector. The first inverter may be configured to deliver inverter AC power via the first inverter connector and the second inverter may be configured to deliver inverter AC power via the second inverter connector. The cable assembly may be configured to receive power from the first and second inverters. The cable assembly may include a plurality of continuous conductors, a first cable connector, and a second cable connector. The plurality of continuous conductors may be configured to receive the inverter AC power delivered by the first and second inverters and deliver the combined power to the AC grid. The first cable connector may be electrically coupled to the plurality of continuous conductors and configured to mate with the first inverter connector to deliver the inverter AC power from the first inverter to the plurality of continuous conductors. Similarly, the second cable connector may be electrically coupled to the plurality of continuous conductors and configured to mate with the second inverter connector to deliver the inverter AC power from the second inverter to the plurality of continuous conductors.

In some embodiments, of the first and second inverters may include an inverter cable for delivering the AC power to the respective first and second inverter connector. Each inverter cable may include a plurality of cable conductors for carrying the inverter AC power. The plurality of cable conductors may have a current-carrying capacity less than a current-carrying capacity of the continuous conductors.

The cable assembly may include a protective circuit element. The protective circuit element may be adapted to carry inverter AC power between the first cable connector and one of the plurality of continuous conductors. In some embodiments, the protective circuit element may be electrically coupled to a first continuous conductor of the plurality of continuous conductors and a second continuous conductor of the plurality of continuous conductors. In some embodiments, the protective circuit element may be embodied as a fuse. In other embodiments, the protective circuit element may be embodied as a surge protection device. For example, the surge protection device may be a metal-oxide varistor.

In some embodiments, the system may further include a replaceable series element connected between the first inverter connector and the first cable connector. The replaceable series element may include a protective circuit element. The replaceable series element may be configured to carry inverter AC power between the first inverter connector and the first cable connector. In some embodiments, the protective circuit element may be electrically coupled to a first continuous conductor of the plurality of continuous conductors and a second continuous conductor of the plurality of continuous conductors. The protective circuit element may be embodied as a fuse. Alternatively, the protective circuit element may be embodied as a surge protection device such as, for example, a metal-oxide varistor.

In some embodiments, the system may further include a photovoltaic module. In such embodiments, the first inverter may be electrically coupled to the photovoltaic module to receive input power therefrom. Additionally, the plurality of continuous conductors may include three or four continuous conductors. Further, in some embodiments, the plurality of continuous conductors may include an earth ground continuous conductor.

According to another aspect, a cable assembly for delivering power from one or more power generation sources to an AC grid may include a plurality of continuous conductors, a first cable connector, a second cable connector, and a replaceable series element. The continuous conductors may be configured to receive power from the power generation sources and delivering the power to the AC grid. The first cable connector may be electrically coupled to the plurality of continuous conductors and configured to couple with a first power generation source to receive source AC power therefrom. Similarly, the second cable connector may be electrically coupled to the plurality of continuous conductors and configured to couple with a second power generation source to receive source AC power therefrom. The replaceable series element may be adapted to carry AC power between the first power generation source and the first cable connector.

In some embodiments, the first power generation source may include a source connector and the replaceable series element may be connected between the source connector and the first cable connector. In such embodiments, the replaceable series element may include a protective circuit element. The replaceable series element may be configured to carry source AC power between the source connector and the cable connector. Additionally, the protective circuit element may be electrically coupled to a first continuous conductor of the plurality of continuous conductors and a second continuous conductor of the plurality of continuous conductors.

The protective circuit element may be embodied as a fuse. Alternatively, the protective circuit element may be embodied as a surge protection device such as, for example, a metal-oxide varistor. Additionally, in some embodiments, the system may further include a photovoltaic module. In such embodiments, the first inverter may be electrically coupled to the photovoltaic module to receive input power therefrom. Additionally, the plurality of continuous conductors may include three or four continuous conductors. Further, in some embodiments, the plurality of continuous conductors may include an earth ground continuous conductor.

According to a further aspect, a system for delivering AC power to a power sink may include a plurality of inverters and a cable assembly. Each inverter may include a inverter connector for delivering power from the inverter. The cable assembly may include a plurality of separable cable connectors and a first cable end. Each separable cable connector may be configured to separably mate with one of the inverter connectors to receive AC power from the corresponding inverter. The first cable end may be configured to deliver the combined power received from the plurality of inventors to the power sink. Additionally, the cable assembly may be configured such that the AC power delivered by each inverter to the power sink passes through only one separable cable connector between the respective inverter and the first cable end.

DESCRIPTION OF THE DRAWINGS

FIG. 7 is a perspective view of one embodiment of a portion of the system of FIG. 4 including a series replaceable element;

FIG. 8 is a simplified schematic of one embodiment of protective circuitry of the series replaceable element of FIG. 7;

FIGS. 11a-11c are simplified illustrations of various embodiments of tapped connections.

DETAILED DESCRIPTION

Figure 1:
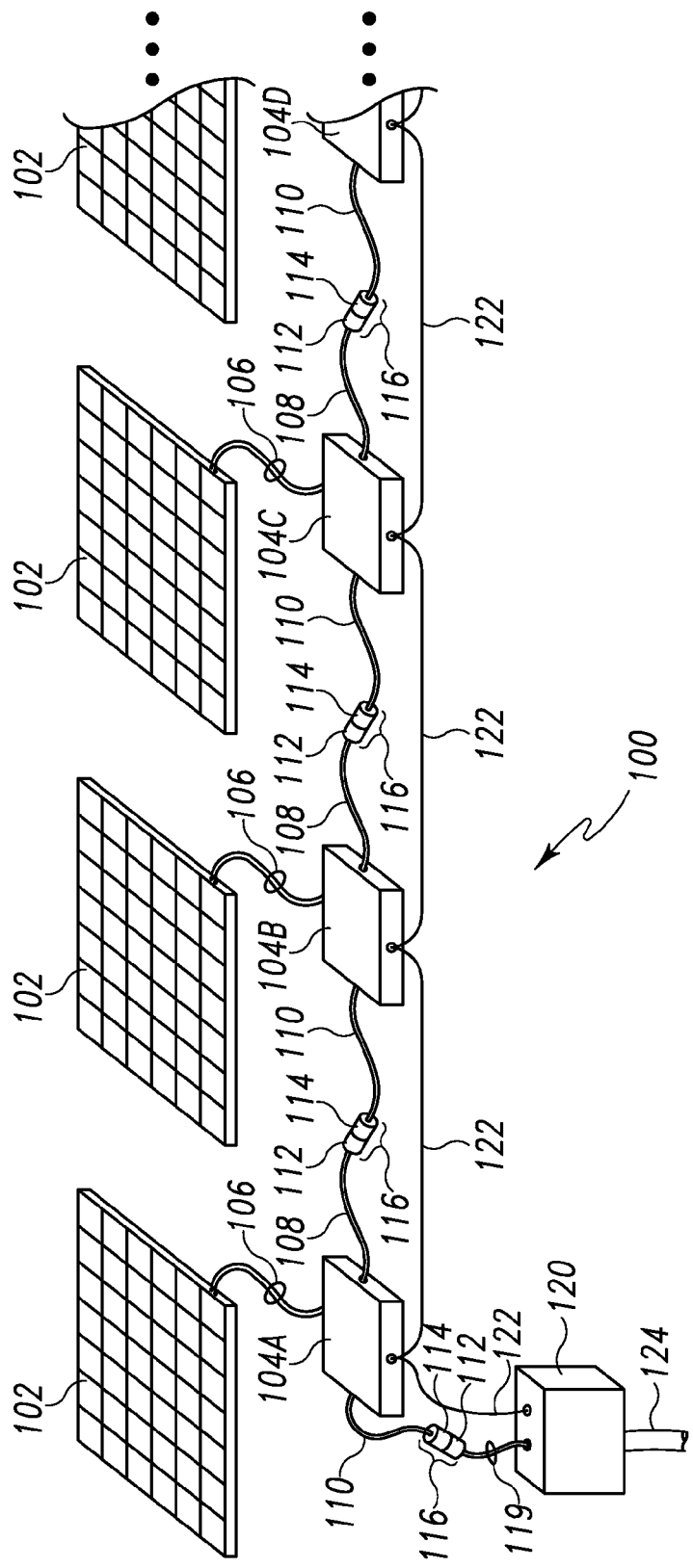
FIG. 1 is a perspective view of a distributed photovoltaic power system.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 4:
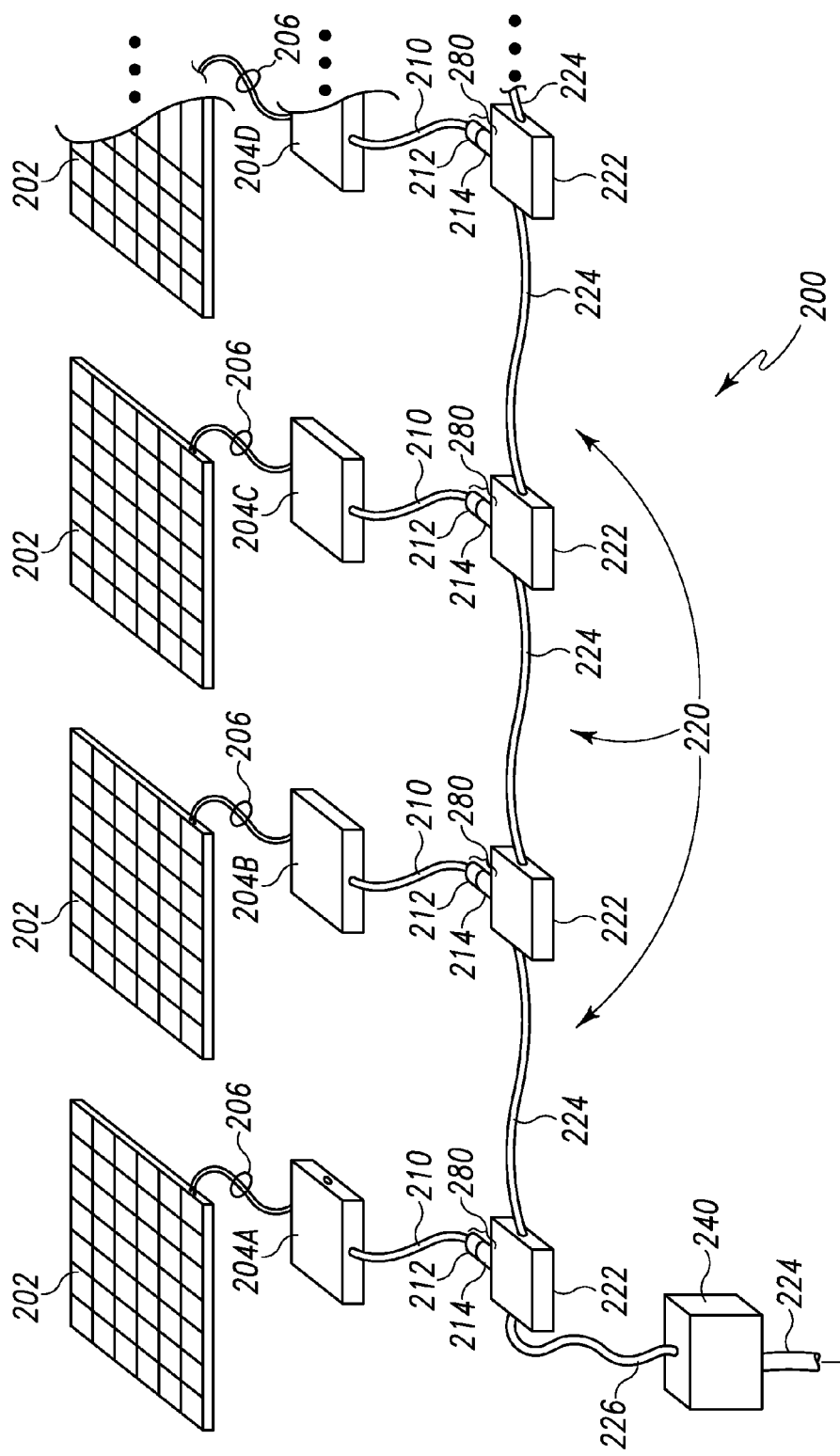
FIG. 4 is a perspective view of a distributed photovoltaic power system according to the present disclosure.
Figure 5:
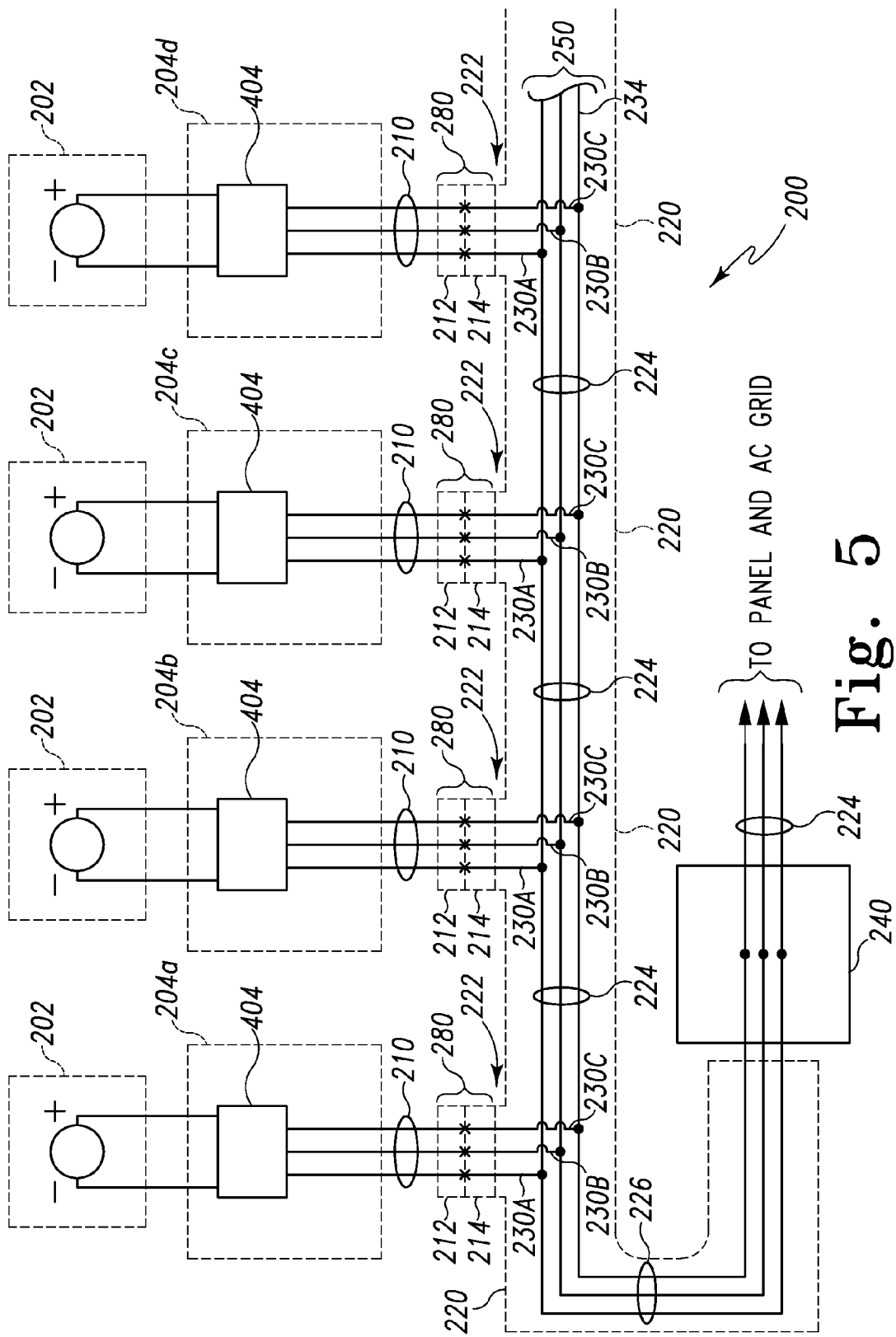
FIG. 5 is a simplified schematic of one embodiment of the system of FIG. 4.

Referring now to FIGS. 4 and 5, in one embodiment, a distributed photovoltaic system 200 includes a plurality of photovoltaic panels 202 and associated inverters 204a-204d. Although the illustrative system 200 includes four photovoltaic panels 202 and associated inverters 204, it should be appreciated that system 200 may include two, three, or more panels 202 and associated inverters 204 in other embodiments. Power from the photovoltaic panels 202 is delivered to the inverters 204 by PV interconnects 206. Each inverter 204a-204d includes a power delivery cable 210 terminated in a power delivery connector 212. For ease of comparison with the system 100 of FIGS. 1 and 2, the system 200 of FIGS. 4 and 5 is configured to deliver power from inverters 204a-204d to a split-phase AC grid (e.g. a 240 VAC grid comprising two 120 VAC "hot" wires and a neutral wire). However, in other embodiments, the system 200 may be configured to deliver power to other power sinks.

The system 200 includes a power delivery cable assembly 220 to which each of the inverters 204 is electrically coupled via a corresponding power delivery cable 210. The power delivery cable assembly 220 delivers the power received from each of the inverters 204 to an the AC grid via an AC junction box 240, which may be an electrical panel that connects to the AC grid or, as illustrated in FIGS. 4 and 5, may provide a connection point between bus conductors 230, 232, 234 and wiring 224 that connects to an AC grid at a downstream panel (not shown).

The power delivery cable assembly 220 includes a power delivery bus 250, embodied as a plurality of continuous conductors 230, 232, 234, and two or more tap connection junctions 222. Each of the inverters 204 are electrically coupled to the power delivery bus 250 to supply power thereto via one of the tap connection junctions 222. The tap connection junctions 222 each include a power bus connector 214 configured to mate with the power delivery connector 212 of the corresponding inverter 204 to form a mated tap connection 280 (mated terminals within each mated tap connection 280 in FIG. 5 are indicated by an "x"). Each of the continuous conductors 230, 232, 234 may be embodied as any type of conductor capable of conducting electricity including, but not limited to, a plurality of wires such as braided wire, monostrand wire, a bus bar, and/or other conductive structures. As used herein, the term "continuous conductor" means an electrical conductor having no in-line separable connection between a first end of the electrical conductor and a second end of the electrical conductor. For example, the illustrative continuous conductors 230, 232, 234 extend from a first end 226 of cable assembly 220 to the remote-most tap connection junction 222 with no interposed separable connection between the first end 226 and the remote-most junction 222. As such, AC power received from each inverter 204 is delivered to the first end 226 (and, in FIG. 4, thence to the AC junction box 240) by passing through a single separable connector (i.e., the respective power bus connector 214) between the respective inverter 204 and the box 240. Conversely, the power bus 150 of the system 100 illustrated in FIGS. 1-3 includes multiple in-line, mated connectors 116. As such, power delivered from, for example, the remote-most inverter 104d of the system 100 passes through multiple connectors 116 between the inverter 104d and the junction box 120.

It should be appreciated that the particular length of the continuous conductors 230, 232, 234 and/or the particular number of tap connection junctions 222 may vary depending on the particular implementation of the system 200. It should also be appreciated that each inverter 204 may be "hard mounted" (e.g., via removable hardware, such as screws) in a position adjacent to its respective solar panel(s) 202 and that the number and relative physical positions of inverters 204 may vary considerably among different system 200 implementations. Use of flexible cables 210 on each inverter may provide flexibility with respect to the relative physical placement of inverters in different system configurations and allow a particular power cable 220 design to accommodate a wide range of physical system configurations.

Each of the tap connection junctions 222 includes corresponding tap conductors 230a, 230b, 230c, which are electrically coupled to and tap off of the continuous conductors 230, 232, 234, respectively. As such, power is delivered from each inverter 204a-204d to the power delivery bus 250 (i.e., to continuous conductors 230, 232, 234) via an associated power delivery cable 210, a mated tap connection 280, and tap conductors 230a, 230b, 230c. An inverter 204a-204d of the kind shown in FIGS. 4 and 5 is referred to herein as a "tap-connected inverter".

Figure 2:
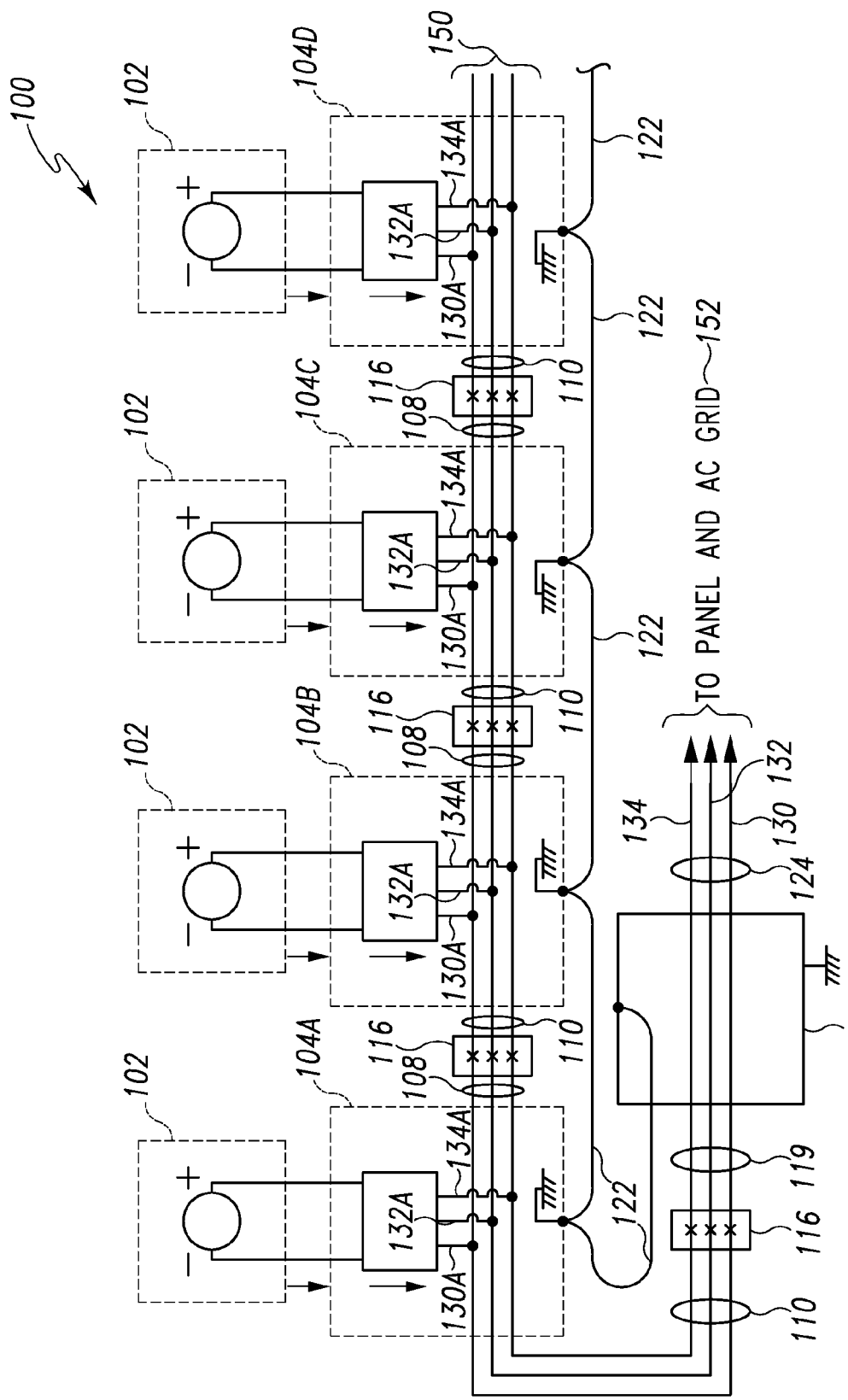
FIG. 2 is a simplified schematic of the system of FIG. 1.

In contrast to the system of FIGS. 1 and 2, in which input and output connectors 112, 114 on series-connected inverters 104a-104d form separable mated connections 116 that are serially connected within the daisy-chained bus 150, the tap-connected inverters 204 in the system 200 of FIGS. 4 and 5 are connected via conductive connections (i.e., tap conductors 230a, 230b, 230c) that tap off of the continuous conductors 230, 232, 234. It should be appreciated that use of taps and continuous conductors, instead of daisy-chained serial connectors, may result in improved efficiency because each mated tap connections 280 carry, on average, less power than mated connectors 116, and hence may have lower losses. In addition, failure of a mated tap connection 280 in the system 200 may result in loss of power delivery from only the affected inverter 204, whereas failure of a mated connector 116 in the system 100 of FIGS. 1 and 2 may result in loss of power delivery from many, and possibly all, upstream inverters 104. Thus the system 200 may exhibit improved reliability and availability compared to the system 100 of FIGS. 1 and 2.

FIGS. 11A through 11C show illustrative embodiments of structures and methods for forming a tap connection to the power delivery bus 250. It should be appreciated that in each there are no separable connectors interposed along the length of a continuous conductive path.

Referring now to FIG. 11A, in one embodiment, the power delivery bus 250 is embodied as a plurality of insulated path wires 231, 233, 235, which comprise, respectively, continuous conductors 230, 232, 234 (e.g., copper wires); likewise, insulated tap wires 231a, 231b, 231c comprise, respectively, tap conductors 230a, 230b, 230c (e.g., copper wires). To electrically coupled the tap conductors 230a, 230b, 230c to the continuous conductors 230, 232, 234, insulation is removed from regions 260a, 260b, 260c of each insulated path wire 231, 233, 235 to expose a portion of the respective continuous conductors 230, 232, 234; likewise, an end of each tap wire 231a, 231b, 231c is stripped of insulation to expose an end portion of respective tap conductors 230a, 230b, 230c. The end of each tap conductor is electrically connected to a respective conductive paths 230, 232, 234 (e.g., by solder) to form a tap connection (three are shown).

In another embodied as illustrated in FIG. 11b, a tap connection (only one is shown) is formed by connecting (e.g., by twisting, soldering) the stripped and uninsulated conductors 230x, 230y, 430a from three insulated wires 331a, 331b and 431a. Connected in this way, the conductors 331a and 331b form a portion of continuous conductive path 230 and conductor 430a forms a tap conductor.

Additionally, in another embodiment as illustrated in FIG. 11c, a tap connection is formed by crimping together (e.g., by use of a parallel crimp connector 433) the stripped and insulated conductors 230x, 230y, 430a from three insulated wires 331a, 331b and 431a. Connected in this way, the conductors 331a and 331b form a portion of continuous conductive path 230 and conductor 430a forms a tap conductor. Further, in some embodiments, the insulated wire formed from wires 331a, 331b is initially cut and stripped to expose opposing ends of the conductors 230x, 230y. The conductors 230x, 230y and the conductor 430a are subsequently electrically coupled together (e.g., via a crimped or soldered connection) to form a tap connection.

Figure 12:
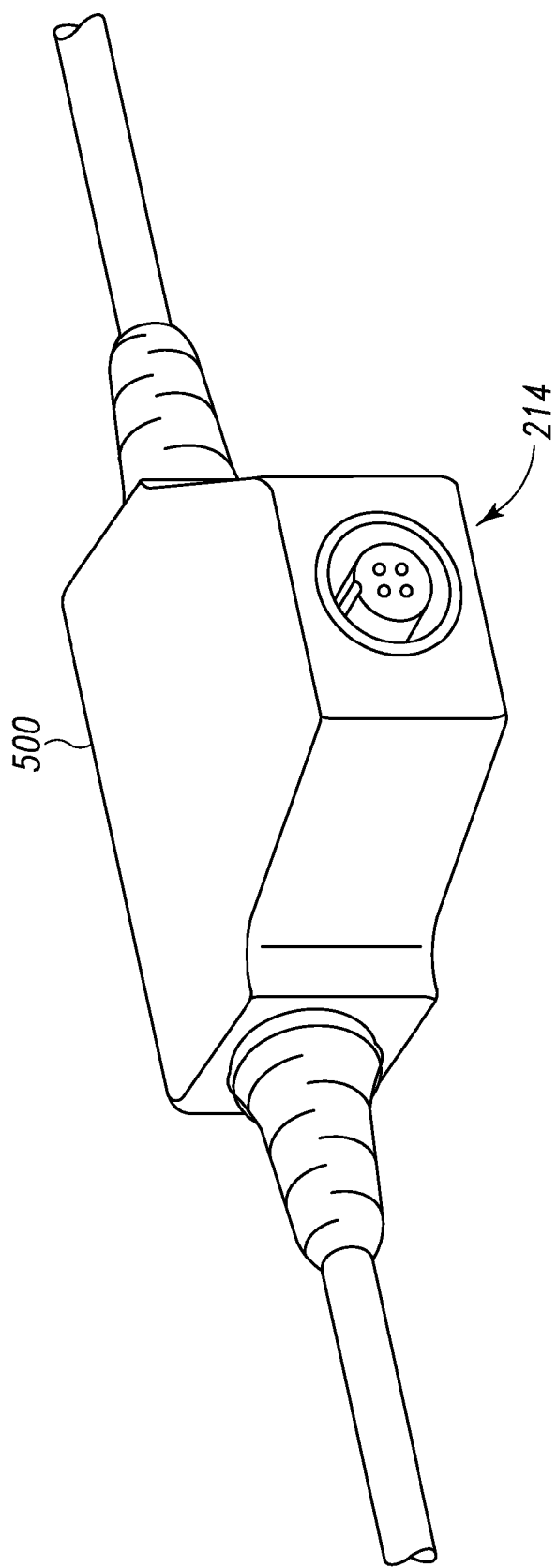
FIG. 12 is an illustration of one embodiment of an overmolded tapped connection.

In some embodiments, as illustrated in FIG. 12, one or more of the tap junctions 222 of the cable assembly 220 may be overmolded to form an overmolded tap junction 500. By overmolding the tap junction, the resiliency to environmental effects of the cable assembly 220 is increased. For example, as shown in FIG. 12, the power bus connector 214 of the overmolded tap junction 500 is inset or otherwise overmolded to reduce the likelihood of incursion of debris, water, and/or the like. Any suitable molding process may be used to form the overmolded tap junction 500.

In the system 200, each tap-connected inverter 104a-104d may comprise a single cable 210, instead of the pair of cables 108, 110 associated with each series-connected inverter 104a-104d in the prior art system 100. Furthermore, in normal operation, the power delivery cables 210 and connectors 212, 214 in the system 200 may only need to be sized to carry the power that can be delivered by a single inverter, whereas the cables 108, 110 and connectors 112, 114 in the prior-art system 100 must be sized to carry the full rated power of the entire array of inverters 104a-104d. For example, in the prior art system, all of the inverter cables 108, 110 may comprise #12 AWG conductors with equivalently rated connectors, whereas in some embodiments of the system 200 the inverter cable 210 may comprise smaller #18AWG conductors with correspondingly smaller connectors. Thus, a system according to the present disclosure may be more cost-effective than a prior art daisy-chained system 100.

Figure 3:
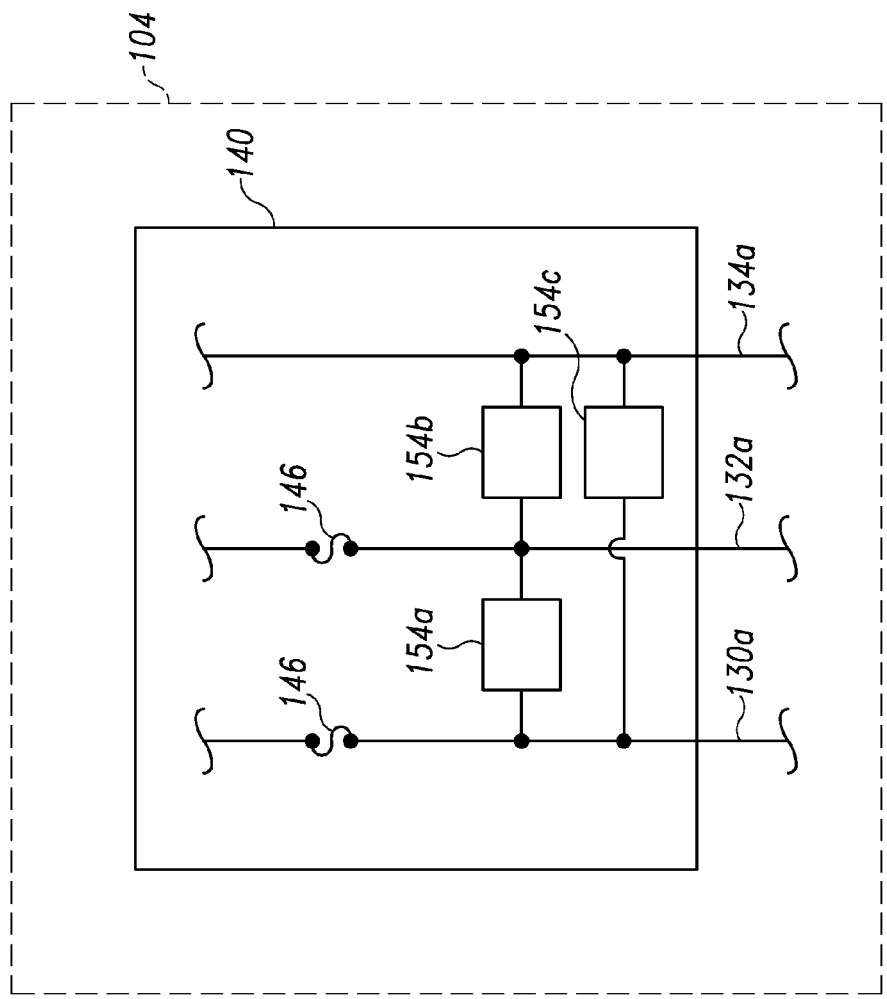
FIG. 3 is a schematic of protective circuitry for an inverter of the system of FIG. 1.
Figure 6:
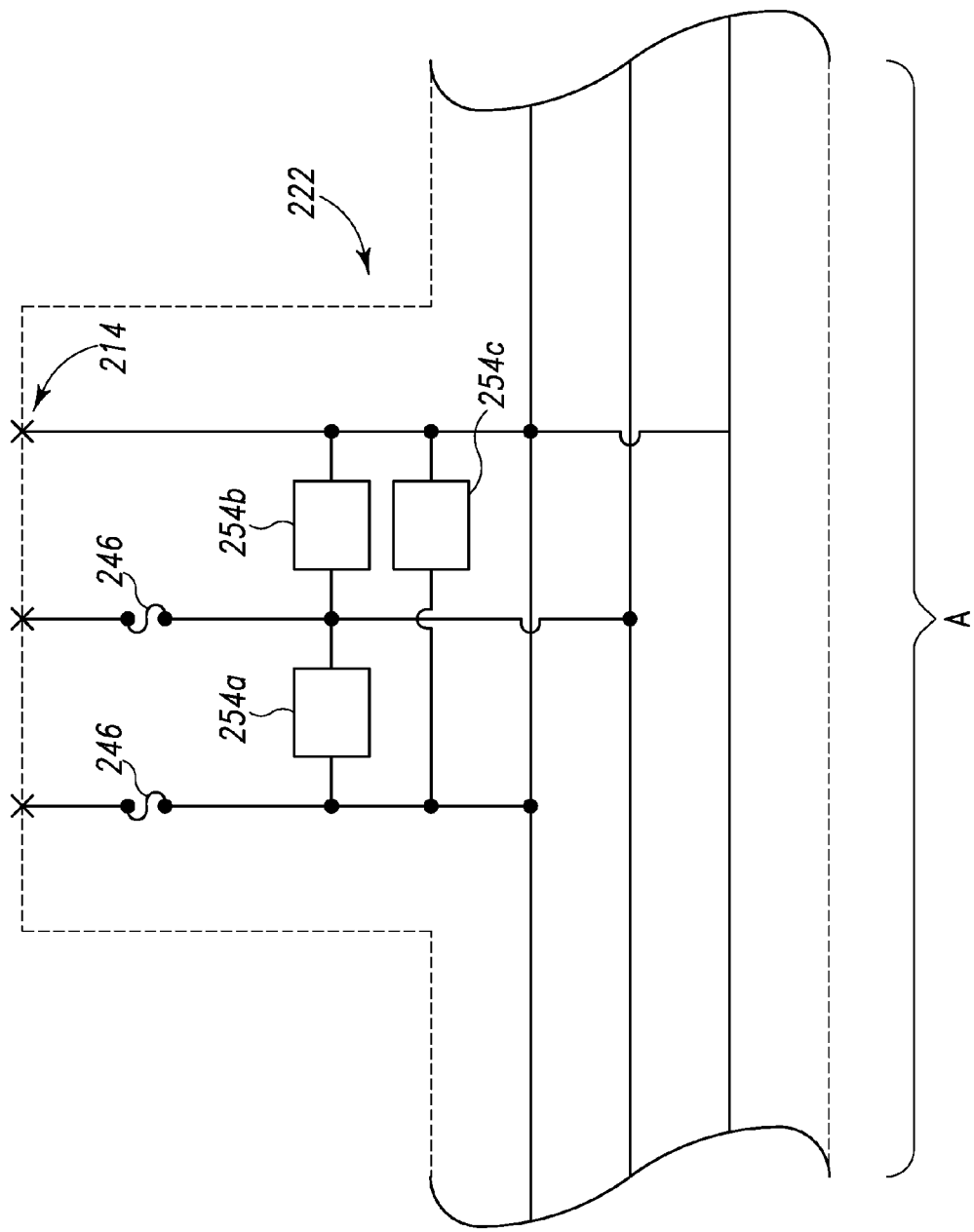
FIG. 6 is a simplified schematic of one embodiment of protective circuitry of the system of FIG. 4.

In some embodiments, protective circuit elements may be incorporated in the power delivery system 200 as illustrated in FIG. 6, which shows a portion of the region of the power delivery cable 220 that is labeled "A" in FIGS. 4 and 5. As illustrated in FIG. 6, fuses 246 and surge protectors 254a-254c are installed within tap connection junction 222. It should be appreciated that by locating fuses in the tap connection junction, as opposed to locating fuses in the inverter (e.g., as shown in FIG. 3 for a prior art system 100), a short circuit in an inverter cable (which may happen if a cable is, e.g., chewed by a pest, such as a rodent or squirrel) may affect only a single inverter. Additionally, it should be appreciated that the magnitude of a fault current that the cable 210 may have to carry may be limited by the rating of the fuse, thereby allowing use of smaller conductors in the cable 210.

In other embodiments, protective circuit elements may be incorporated in the power delivery system 200 as illustrated in FIGS. 7 and 8. As illustrated in FIG. 7, which shows the portion of the system 200 that is labeled "A" in FIG. 4, a replaceable series element 300 comprises connector 314 that connects to power delivery connector 212 at the end of cable 210, and connector 312 that connects to power bus connector 214 at tap connection junction 222. As shown in FIG. 8, circuit protective elements, such as fuses 246 and surge protectors 254a-254c, may be installed within the replaceable series element 300. Use of the replaceable series element 300 offers the same benefits discussed above with respect to FIG. 6 and may also simplify replacement of protective elements and also simplify the design of the power delivery cable 220 (by eliminating the need for circuit protective elements, and means for accessing those elements, if provided, within the cable assembly). Replaceable series elements may also be configured as extenders to increase the length of inverter cables 210; such extender cables may be configured to also include protective elements.

Figure 10:
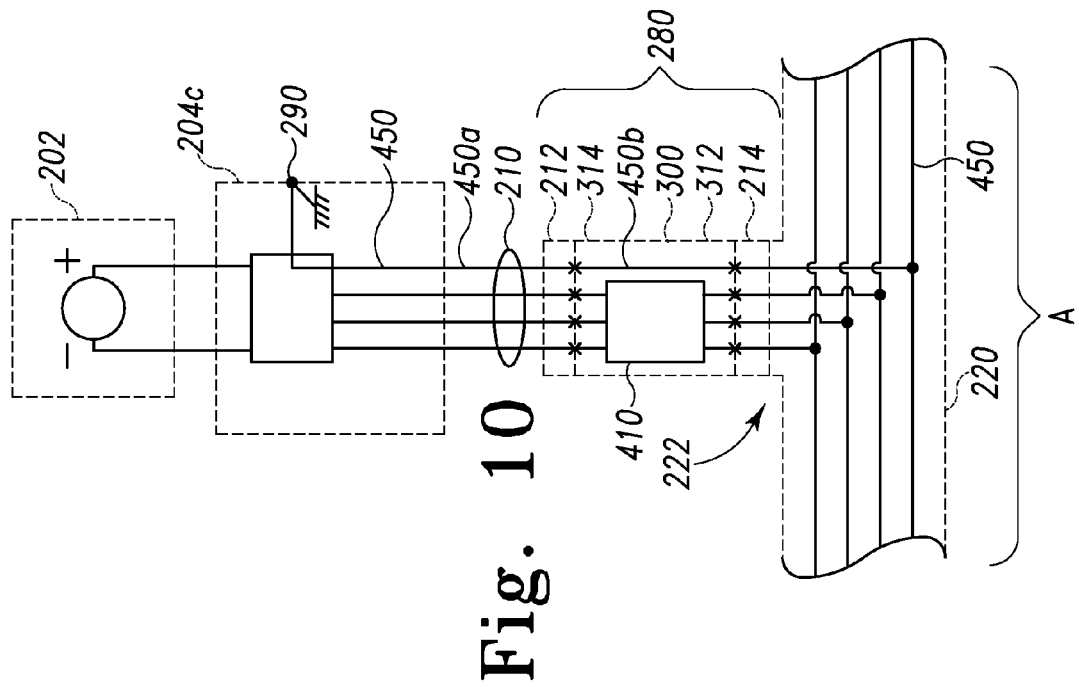
FIG. 10 is a simplified schematic of a portion of the system 100 of FIG. 4, including one embodiment of a series replaceable element and an earth grounding interconnection.
Figure 9:
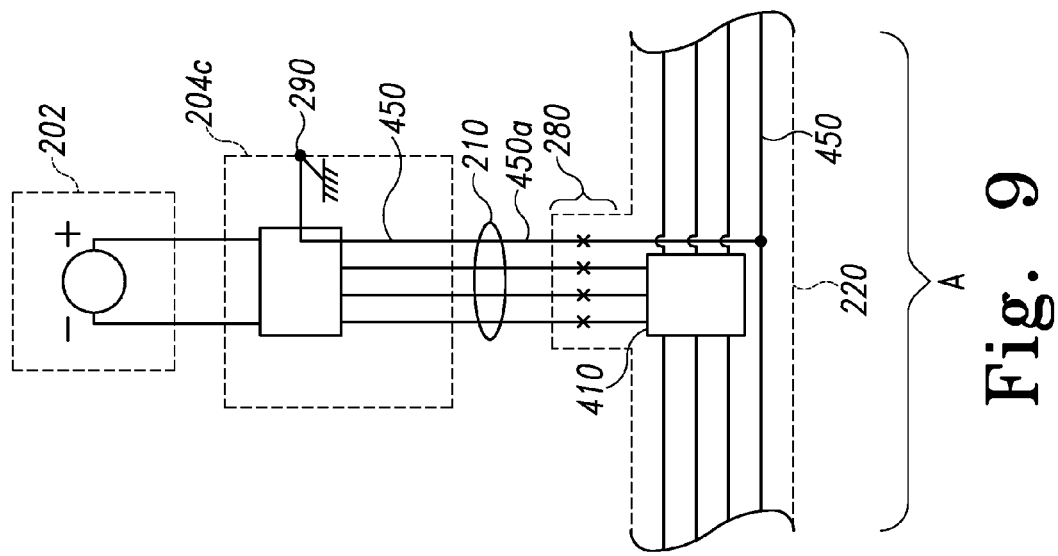
FIG. 9 is a simplified schematic of a portion of the system 100 of FIG. 4 including one embodiment of an earth grounding interconnection.

Additionally, in some embodiments, an earth ground may be provided to an inverter 204 in the power delivery system 200 as illustrated in FIGS. 9 and 10, each of which shows the portion of the system 200 that is labeled "A" in FIGS. 4 and 5. FIG. 9 shows a portion of a system 200 comprising a power delivery cable 220 that incorporates circuit protective elements (not shown in detail in FIG. 9, but indicated by the element 410) within a tap connection junction 222; FIG. 10 shows a portion of a system 200 in which a replaceable series element 300 comprises circuit protective elements (not shown in detail in FIG. 10, but indicated by the element 410). In FIGS. 9 and 10, the power delivery cable 220 comprises an earth ground bus conductor 450 and the inverter cable 210 comprises an inverter earth ground conductor 450a that is connected to a earth grounding point 290 within inverter 204c. In FIG. 9 the earth ground bus conductor 450 connects to inverter earth ground conductor 450a via the mated tap connection 280; in FIG. 10 the earth ground bus conductor 450 connects to inverter earth ground conductor 450a via the mated tap connection 280 and a ground conductor 450b in replaceable series element 300.

It is understood that reference to photovoltaic systems is illustrative and that the present disclosure is equally applicable to a variety of power delivery system embodiments, e.g., systems comprising fuel cells or other power generation sources. It should also be understood although the drawings illustrate power generating device arrays comprising a particular number of array elements, the present disclosure may be generally applicable to arrays including two or more power generating devices.

There is a plurality of advantages of the present disclosure arising from the various features of the apparatuses, circuits, and methods described herein. It will be noted that alternative embodiments of the apparatuses, circuits, and methods of the present disclosure may not include all of the features described yet still benefit from at least some of the advantages of such features. Those of ordinary skill in the art may readily devise their own implementations of the apparatuses, circuits, and methods that incorporate one or more of the features of the present disclosure and fall within the spirit and scope of the present invention as defined by the appended claims.

The invention claimed is:

1. A cable assembly for delivering a combined power from a plurality of solar inverters to an alternating current (AC) grid, the cable assembly comprising:
   a first end to deliver the combined power from the plurality of solar inverters to the AC grid;
   a first cable connector located at a distal end of the cable assembly opposite the first end, the first cable connector configured to plug with and unplug from an inverter output connector of a first solar inverter of the plurality of solar inverters;
   a plurality of continuous conductors electrically connected to the first end and the first cable connector; and
   a second cable connector electrically coupled to the plurality of continuous conductors via a tap connection located between the first end and the first cable connector such that the continuous conductors are unbroken at the tap connection, the second cable connector configured to plug with and unplug from an inverter output connector of a second solar inverter of the plurality of solar inverters.

2. The cable assembly of claim 1, further comprising an extender cable having a first extender cable connector connected to one of the first cable connector and the second cable connector and a second extender cable connector configured to plug with and unplug from the inverter output of the corresponding first and second solar inverter.

3. The cable assembly of claim 2, wherein the extender cable includes a replaceable series element.

4. The cable assembly of claim 3, wherein the replaceable series element includes a protective circuit element.

5. The cable assembly of claim 4, wherein the protective circuit element carries power between the one of the first cable connector and the second cable connector and the inverter output of the corresponding first and second solar inverter.

6. The cable assembly of claim 1, further comprising a plurality of second cable connectors, each second cable connector electrically coupled to the plurality of continuous conductors via a corresponding tap connection located between the first end and the first cable connector such that the continuous conductors are unbroken at each tap connection.

7. The cable assembly of claim 6, wherein the inline cable connector is overmolded.

8. The cable assembly of claim 1, wherein the second cable connector comprises a plurality of connector conductors, each of the plurality of connector conductor being electrically connected to a corresponding continuous conductor of the plurality of continuous conductors at a corresponding tap connection, each corresponding tap connection comprising a solder connection.

9. The cable assembly of claim 1, wherein the second cable connector comprises a plurality of connector conductors, each of the plurality of connector conductor being electrically connected to a corresponding continuous conductor of the plurality of continuous conductors at a corresponding tap connection by a twisted-wire connection such that the corresponding connector conductor and the corresponding continuous conductor are twisted together at the tap connection.

10. The cable assembly of claim 1, wherein the second cable connector comprises a plurality of connector conductors, each of the plurality of connector conductor being electrically connected to a corresponding continuous conductor of the plurality of continuous conductors at a corresponding tap connection by a corresponding crimp connector electrically connected to the corresponding connector conductor and the corresponding continuous conductor.

11. The cable assembly of claim 1, wherein the second cable connector comprises an inline cable connector.

12. The cable assembly of claim 1, wherein the second cable connector comprises a plurality of connector conductors, each of the plurality of connector conductors being electrically connected to a corresponding continuous conductor of the plurality of continuous conductors and having a current-carrying capacity substantially less than the corresponding continuous conductor.

13. The cable assembly of claim 1, wherein the plurality of continuous conductors comprises a first hot continuous conductor, a second hot continuous conductor, and a neutral continuous conductor.

14. A method of interconnecting a plurality of solar power inverters using a cable assembly having a plurality of cable connectors that are each configured to plug with and unplug from a corresponding output connector of a solar power inverter, the plurality of cable connectors being connected in parallel with each other to a plurality of continuous conductors of the cable assembly such that the continuous conductors are unbroken at each corresponding connection, the method comprising:

connecting an output connector of a first solar power inverter to a first cable connector of the plurality of cable connectors of the cable assembly;

connecting an output connector of a second solar power inverter to a second cable connector of the plurality of cable connectors of the cable assembly; and connecting an output connector of a solar third power inverter to a third cable connector of the plurality of cable connectors of the cable assembly located between the first and second cable connectors such that each of the first, second, and third solar power inverters are electrically coupled in parallel via a plurality of continuous conductors of the cable assembly that extend from the first cable connector to the second cable connector.

15. The method of claim 14, further comprising:

electrically coupling a delivery end of the cable assembly, opposite the first cable connector, to an alternating current (AC) power grid; and delivering a combined power from the first, second, and third solar power inverters to the AC power grid via the continuous conductors of the cable assembly.

16. A cable assembly for delivering alternating current (AC) power from a plurality of direct current-alternating current (DC-AC) power inverters to an AC grid, the cable assembly comprising:

a first end to deliver the combined AC power from the plurality of DC-AC power inverters to the AC grid;

a first connection junction located at a distal end of the cable assembly opposite the first end, the first connection junction comprising (i) a first connector to plug with and unplug from a corresponding output connector of a first DC-AC power inverter of the plurality of DC-AC power inverters and (ii) three connector wire conductors electrically connected to the first connector;

a first hot continuous wire conductor, a second hot continuous wire conductor, a neutral wire conductor, each of continuous wire conductors being electrically connected to the first end and a corresponding one of the three connector wire conductors of the first connection junction;

a plurality of second connection junctions located between the first end and the first connection junction, each of the plurality of second connection junctions comprising (i) a second connector to plug with and unplug from a corresponding output connector of a corresponding DC-AC power inverter of the plurality of DC-AC power inverters and (ii) three connector conductors electrically connected to the corresponding second connector, each of the three connector conductors of each second connection junction being electrically connected to a corresponding one of the first hot continuous wire conductor, the second hot continuous wired conductor, and the neutral wire conductor at a corresponding tap connection such that each of the continuous wired conductors are unbroken at the corresponding tap connection.

17. The cable assembly of claim 16, wherein each corresponding tap connection comprising a solder connection.

18. The cable assembly of claim 16, wherein each corresponding tap connection comprises a twisted-wire connection such that the corresponding connector conductor and the corresponding continuous wire conductor are twisted together at the associated tap connection.

19. The cable assembly of claim 16, wherein each of the three connector conductors is electrically connected to the corresponding continuous wire conductor at the corresponding tap connection by a corresponding crimp connector electrically connected to the connector conductor and the corresponding continuous wire conductor.

* * * * *